(12) United States Patent
Yang et al.

(10) Patent No.: US 12,185,638 B2
(45) Date of Patent: Dec. 31, 2024

(54) METAL/DIELECTRIC/METAL HYBRID HARD MASK TO DEFINE ULTRA-LARGE HEIGHT TOP ELECTRODE FOR SUB 60NM MRAM DEVICES

(71) Applicant: Taiwan Semiconductor Manufacturing Company, Ltd., Hsin-Chu (TW)

(72) Inventors: Yi Yang, Fremont, CA (US); Yu-Jen Wang, San Jose, CA (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 18/361,677

(22) Filed: Jul. 28, 2023

(65) Prior Publication Data

US 2023/0389436 A1 Nov. 30, 2023

Related U.S. Application Data

(60) Continuation of application No. 17/099,188, filed on Nov. 16, 2020, now Pat. No. 11,723,281, which is a division of application No. 15/902,391, filed on Feb. 22, 2018, now Pat. No. 10,840,440.

(51) Int. Cl.
*H10B 61/00* (2023.01)
*H10N 50/01* (2023.01)

(52) U.S. Cl.
CPC .............. *H10N 50/01* (2023.02); *H10B 61/00* (2023.02)

(58) Field of Classification Search
CPC ......... H01L 43/12; H01L 43/08; H01L 43/02; H01L 27/228; H01L 43/10; H10N 50/01; H10N 50/10; H10N 50/80; H10N 50/85; H10N 70/063
See application file for complete search history.

(56) References Cited

U.S. PATENT DOCUMENTS

| | | | |
|---|---|---|---|
| 6,806,096 B1 | 10/2004 | Kim et al. | |
| 8,975,089 B1 | 3/2015 | Jung et al. | |
| 9,490,424 B2 | 11/2016 | Lu | |
| 9,564,577 B1 | 2/2017 | Hsu et al. | |
| 9,608,200 B2 | 3/2017 | Shen et al. | |
| 2003/0180968 A1* | 9/2003 | Nallan | H01L 23/564 257/E43.006 |
| 2010/0311243 A1 | 12/2010 | Mao | |
| 2012/0028373 A1 | 2/2012 | Belen et al. | |
| 2013/0244344 A1 | 9/2013 | Malmhall et al. | |
| 2013/0267042 A1 | 10/2013 | Satoh | |
| 2014/0098459 A1 | 4/2014 | Lee et al. | |
| 2016/0268499 A1 | 9/2016 | You et al. | |
| 2016/0351799 A1 | 12/2016 | Xue et al. | |
| 2019/0259940 A1 | 8/2019 | Yang et al. | |

\* cited by examiner

*Primary Examiner* — Tony Tran
(74) *Attorney, Agent, or Firm* — HAYNES AND BOONE, LLP

(57) ABSTRACT

An ultra-large height top electrode for MRAM is achieved by employing a novel thin metal/thick dielectric/thick metal hybrid hard mask stack. Etching parameters are chosen to etch the dielectric quickly but to have an extremely low etch rate on the metals above and underneath. Because of the protection of the large thickness of the dielectric layer, the ultra-large height metal hard mask is etched with high integrity, eventually making a large height top electrode possible.

20 Claims, 1 Drawing Sheet

METAL/DIELECTRIC/METAL HYBRID HARD MASK TO DEFINE ULTRA-LARGE HEIGHT TOP ELECTRODE FOR SUB 60NM MRAM DEVICES

PRIORITY DATA

The present application is a continuation of U.S. application Ser. No. 17/099,188, filed Nov. 16, 2020, which is a continuation of U.S. application Ser. No. 15/902,391, filed Feb. 22, 2018, each of which is hereby incorporated by reference in its entirety.

TECHNICAL FIELD

This application relates to the general field of magnetic tunneling junctions (MTJ) and, more particularly, to etching methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During photolithography, patterns are transferred from a photomask to a light-sensitive photoresist and later transferred to MTJ stacks by RIE, IBE or their combination, forming separate and non-interacting MTJ devices.

To have a large enough process window, a large height top electrode on top of MTJ is preferred so that any consumption during the later processes such as MTJ etch and CMP do not affect the device integrity. Moreover, people have found that while etching MTJ, the non-volatile metal re-deposition onto the junction and electrically shorted devices can be greatly reduced if one can over-etch into the bottom electrode, which again requires a large height top electrode. To define this large height top electrode, another hard mask or hard mask stack which can transfer the sub 60 nm photoresist patterns with high integrity is needed. One widely used hard mask stack in the IC industry is composed of a thin (~30 nm) silicon hard mask on top of a thick (~200-300 nm) carbon hard mask, deposited by CVD or spin-coating. Unfortunately, this stack is still not selective enough when it comes to the patterning of MRAM devices' electrode materials such as Ta and TiN with a large aspect ratio. As a result, all MRAM devices in literature have an electrode height less than 60 nm, which does not provide enough process window for the patterning of future sub 60 nm devices.

Several patents teach using more than one hard mask layer including: U.S. Pat. No. 8,975,089 (Jung et al), U.S. Pat. No. 9,490,424 (Lu), and U.S. Pat. No. 9,608,200 (Shen et al). All of these references are different from the present disclosure.

SUMMARY

It is an object of the present disclosure to provide an improved method of forming MTJ structures having a thick metal top electrode.

Yet another object of the present disclosure is to provide a method of forming MTJ structures having a thick metal top electrode by using a thick hybrid hard mask stack.

In accordance with the objectives of the present disclosure, a method for etching a magnetic tunneling junction (MTJ) structure is achieved. An ultra-large height top electrode for MRAM is achieved by employing a novel thin metal/thick dielectric/thick metal hybrid hard mask stack. Etching parameters are chosen to etch the dielectric quickly but to have an extremely low etch rate on the metals above and underneath. Because of the protection of the large thickness of the dielectric layer, the ultra-large height metal hard mask is etched with high integrity, eventually making a large height top electrode possible.

Also in accordance with the objectives of the present disclosure, a method for etching a magnetic tunneling junction (MTJ) structure is achieved. A bottom electrode is provided on a substrate. A MTJ stack is deposited on the bottom electrode. A top electrode layer having a first thickness is deposited on the MTJ stack. A hybrid hard mask is formed on the top electrode layer wherein the hybrid hard mask comprises a first dielectric mask layer having a mask thickness of more than four times the first thickness and second and third mask layers on the first dielectric mask layer. A photo resist pattern is formed on the hybrid hard mask. First, the second and third mask layers of the hybrid hard mask are etched where it is not covered by the photo resist pattern using a first etching chemistry. Second, the hybrid hard mask is etched where it is not covered by remaining second and third mask layers using a second etching chemistry. Next, the top electrode is etched where it is not covered by the remaining hybrid hard mask wherein a portion of the first dielectric mask layer remains on the patterned top electrode. Finally, the MTJ stack is etched where it is not covered by the patterned top electrode wherein overetching is performed wherein a MTJ device is formed and wherein the bottom electrode is etched into and wherein re-deposition material is formed on sidewalls of the bottom electrode underlying the MTJ device and not on sidewalls of the MTJ device and wherein the remaining top electrode has a second thickness no less than 80% of the first thickness.

BRIEF DESCRIPTION OF THE DRAWINGS

In the accompanying drawings forming a material part of this description, there is shown.

DETAILED DESCRIPTION

In this disclosure, the ultra-large height top electrode for MRAM is achieved by employing a novel thin metal/thick dielectric/thick metal hybrid hard mask stack. Specifically, we firstly transfer the photoresist pattern into the first thin layer of metal, such as Ti, TiN, Ta, or TaN, using a fluorine carbon plasma which has a high fluorine ratio such as $CF_4$ and $CHF_3$. Next, the dielectric layer such as $SiO_2$ is plasma etched by $C_4F_8$ or $CH_2F_2$ alone or mixed with Ar and $O_2$. This gas specie etches the dielectric quickly but has an extremely low etch rate on the metals above and underneath. The second thick metal layer is etched again by the same gas specie as the first thin metal layer. Because of the protection of the large thickness of the dielectric layer, the ultra-large height metal hard mask is etched with high integrity, eventually making a large height top electrode possible.

For our current process flow, the top electrode of MRAM devices is patterned by photoresist directly. The largest possible electrode height is limited by the height of the photoresist pattern which can collapse if the aspect ratio is too high. In this disclosure, we insert a novel hybrid hard mask stack with an ultra-large total thickness between the photoresist and the top electrode. By choosing the right etch gas chemistry for each layer within the stack, the sub 60 nm patterns can be transferred into the large height top electrode with high quality. The original height limit on MRAM top electrode by photolithography and plasma etch does not exist anymore. Moreover, compared to other complex hard mask stacks in the IC industry such as silicon and carbon hard masks, the materials and plasma gas species used in this hybrid hard mask stack are more common and easier to process.

Figure 1:
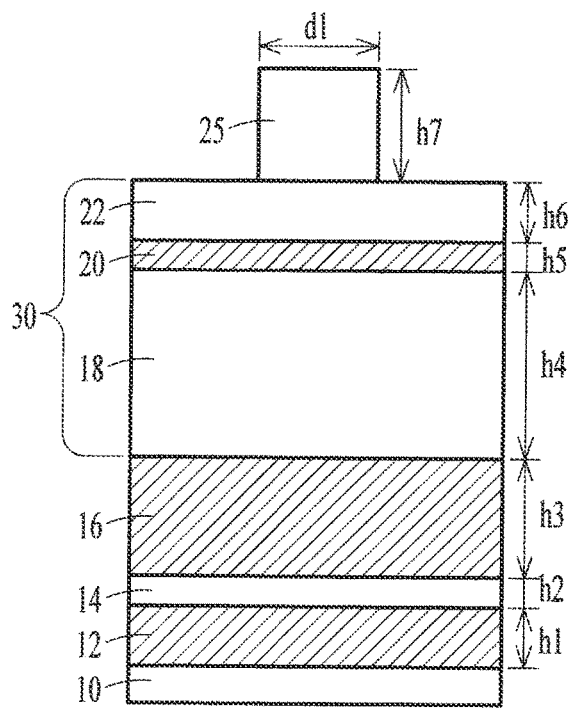
FIGS. 1 through 5 illustrate in cross-sectional representation steps in a preferred embodiment of the present disclosure.

The preferred embodiment of the present disclosure will be described in more detail with reference to FIGS. 1-5. FIG. 1 illustrates a bottom electrode layer 12 formed on a semiconductor substrate 10. Bottom electrode 12 is preferably Ti, TiN, Ta, or TaN with thickness h1 of greater than or equal to 50 nm. Next, the MTJ film layers are deposited, typically including a seed layer, a pinned layer, a barrier layer, a free layer, and a cap layer, for example. These layers form the MTJ film stack 14, having a thickness h2 of between about 10 and 30 nm.

On top of MTJ stack 14, a thick metal hard mask 16 such as Ta, Ti, TaN or TiN is deposited, preferably to a thickness h3 of greater than or equal to 100 nm. The hard mask will form the top electrode after etching is complete. Next, a hybrid hard mask stack is sequentially formed on top of the metal hard mask 16.

An ultra-thick $SiO_2$ layer 18 with thickness h4 of greater than or equal to 400 nm is deposited as a dielectric hard mask. Sequentially another thin Ti, TiN, Ta, or TaN layer 20 with thickness h5 of between about 30 and 50 nm smaller than the top electrode layer 16 underneath is deposited as the metal hard mask. Finally, a dielectric anti-reflective coating (DARC) 20 such as silicon oxynitride (SiON) or organic BARC with thickness h6 of between about 30 and 90 nm is spin-coated onto the metal hard mask layer 20. This completes the hybrid hard mask stack 30.

A photoresist pattern 25 with size d1 of between about 70 and 80 nm and thickness h7 of between about 100 and 300 nm is then patterned by photolithography on top of the hybrid hard mask stack 30.

Figure 2:
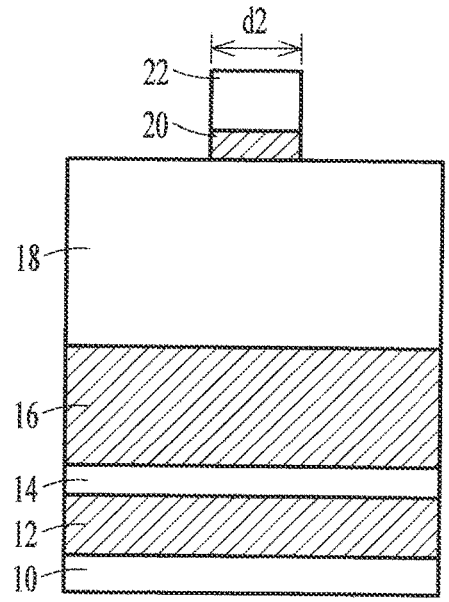

FIGS. 2-5 illustrate steps in the process of fabricating MTJ structures using hybrid hard mask 30. As shown in FIG. 2, during the first RIE etch, the DARC layer 22 and the metal layer 20 are firstly patterned by a fluorine carbon based plasma such as $CF_4$ or $CHF_3$ alone, or mixed with Ar and $N_2$. Alternatively, the first etching could be with a halogen plasma such as $Cl_2$ alone or mixed with $BCl_3$. After this first etching step, the photoresist pillar has been removed and the DARC and metal layer pillar 22/20 has a pattern size d2 of between about 60 and 70 nm. $O_2$ can be added to the etching plasma to greatly reduce the pillar size to 50 nm or below.

Figure 3:
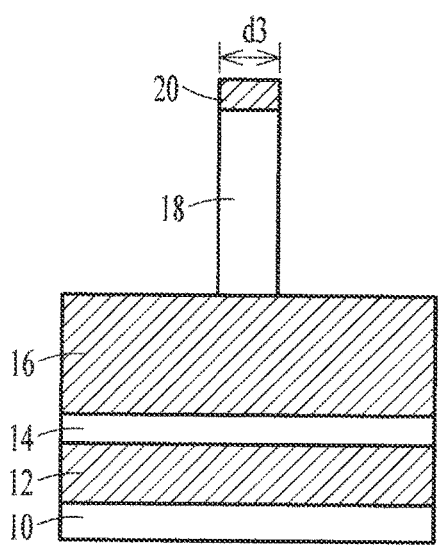

As illustrated in FIG. 3, the pattern is then transferred to the ultra-thick dielectric layer 18 by $C_4F_8$ or $CH_2F_2$ alone or mixed with Ar and/or $O_2$. The DARC mask layer 22 is removed and the resulting pillar size d3 is between about 40 and 50 nm. This gas has a very high etch rate on the dielectric but a low etch rate on the metal hard mask as summarized in Table 1. Therefore most of the top electrode metal hard mask 16 still remains after the dielectric 18 is etched.

TABLE 1

| Material | Etch Chemistry | Etch rate (A/s) | Etch selectivity |
|---|---|---|---|
| $SiO_2$ | $Ar/O_2/C_4F_8$ | 46 | 23:1 |
| TIN | | 2 | |
| $SiO_2$ | $CF_4$ | 129 | 2.9:1 |
| TIN | | 45 | |

Figure 4:
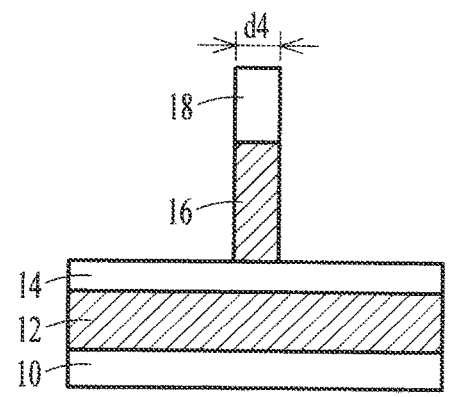

Next, as illustrated in FIG. 4, the bottom ultra-large thickness metal hard mask is etched by a fluorine carbon such as $CF_4$ or a halogen such as $Cl_2$ alone or mixed with $BCl_3$, resulting in a pillar size d4 of between about 30 and 40 nm. Although some of the dielectric layer 18 is consumed during this step, its large initial thickness ensures the integrity of the large height metal hard mask 16. Since the dielectric thickness is four times the thickness of the metal underneath, 100% of the metal hard mask 16 will remain.

Figure 5:
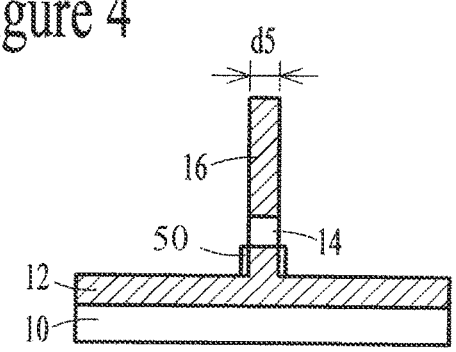

During the final MTJ etch, a great over etch is applied so that any non-volatile metal re-deposition 30 only covers the area below the MTJ, as shown in FIG. 5, reducing the shorted devices and improving the performance. The final pattern size of the MTJ d5 is between about 20 and 30 nm. Since the dielectric hard mask 18 is thick enough, the remaining top electrode height h8 should be the same or very similar to the initial deposition thickness h3 of greater than or equal to 100 nm. That is, the top electrode thickness will be at least 80% of the original thickness of the as-deposited top electrode layer, at least 80 nm for an original deposition thickness of 100 nm. This will benefit the later processes such as CMP.

The present disclosure provides a novel hybrid hard mask stack which can transfer the sub 60 nm photoresist pattern into the MTJ, with an ultra-large top electrode height of over 100 nm. With the process of the present disclosure, the original height limit on MRAM top electrodes by photolithography and plasma etch no longer exists. Consequently when serving as the hard mask for the later MTJ etching, this top electrode ensures that any consumption during this and later process steps does not affect the device integrity. It also allows for a great over etch of the MTJ, reducing the amount of metal re-deposition onto the MTJ sidewall and, thus, shorted devices. The sub 60 nm MRAM device yield and performance are improved by this new integration.

The process of the present disclosure will be used for MRAM chips of the size smaller than 60 nm, which require a larger process margin during MTJ etch and CMP processes. It will also greatly benefit from the reduced MTJ sidewall metal re-deposition due to its large edge-effect, i.e., small size devices have a relatively large sidewall ratio.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:
1. A method comprising in sequential order of:
   providing a first electrode on a substrate;
   forming a stack of magnetic tunneling junction (MTJ) layers on the first electrode;
   forming a second electrode on the stack of MTJ layers;

forming a hybrid hard mask on the second electrode, wherein the hybrid hard mask includes a first material layer, a second material layer and a third material layer, wherein the first, second and third material layers are formed of different materials from each other;

patterning the third material layer and the second material layer;

patterning the first material layer while using the patterned third material layer and the patterned second material layer as a first mask;

patterning the second electrode while using the patterned first mask layer as a second mask; and performing an over etching on the stack of MTJ layers and the first electrode using the patterned second electrode as a third mask, wherein the over etching includes over etching the stack of MTJ layers such that re-deposition material is formed on sidewalls of the first electrode without being formed on the stack of MTJ layers, wherein after the performing of the over etching on the stack of MTJ layers and the first electrode the patterned second electrode is free of interfacing with any of the patterned first material layer, wherein after the performing of the over etching on the stack of MTJ layers and the first electrode the hybrid hard mask is completely removed.

2. The method of claim 1, wherein at least one of the first, second and third material layers is formed of a metal material.

3. The method of claim 2, wherein the metal material includes a metal selected from the group consisting of Ti and Ta.

4. The method of claim 1, wherein the patterning of the third material layer and the second material layer includes using a first fluorine carbon based plasma process, and wherein the patterning of the first material layer while using the patterned third material layer and the patterned second material layer as the first mask includes using a second fluorine carbon based plasma process that is different than the first fluorine carbon based plasma process.

5. The method of claim 4, wherein the first fluorine carbon based plasma process includes using at least one of $CF_4$ or $CHF_3$, and wherein the second fluorine carbon based plasma process includes using at least one of $C_4F_8$ or $CH_2F_2$.

6. The method of claim 1, wherein the patterning of the third material layer and the second material layer includes using a halogen plasma.

7. The method of claim 6, wherein the halogen plasma includes at least one of $Cl_2$ and $BCl_3$.

8. The method of claim 1, wherein a top surface of the second material layer is exposed after the patterning the first material layer.

9. A method comprising in sequential order of:

forming a stack of magnetic tunneling junction (MTJ) layers on a first electrode;

forming a second electrode directly on the stack of MTJ layers;

forming a hybrid hard mask directly on the second electrode, wherein the hybrid hard mask includes:

a first dielectric layer disposed directly on the second electrode;

a first metal layer disposed directly on the first dielectric layer, the first metal layer formed of the same material as the second electrode; and a second dielectric layer disposed directly on the first metal layer;

patterning the second dielectric layer and the first metal layer;

patterning the first dielectric layer while using the patterned second dielectric layer and the patterned first metal layer as a first mask, wherein the patterned first metal layer has a first sidewall surface, a second sidewall surface that opposes the first sidewall surface and a top surface that extends from the first sidewall surface to the second sidewall surface, wherein the top surface, the first sidewall surface and the second sidewall surface of the patterned first metal layer are exposed after the patterning the first dielectric layer;

patterning the second electrode while using the patterned first dielectric layer as a second mask; and performing an over etching on the stack of MTJ layers and the first electrode using the patterned second electrode as a third mask, wherein the over etching includes over etching the stack of MTJ layers such that re-deposition material is formed on the first electrode without being formed on the stack of MTJ layers.

10. The method of claim 9, wherein a portion of the stack of MTJ layers is exposed after the patterning of the second electrode.

11. The method of claim 9, wherein the second dielectric layer is a silicon oxynitride layer.

12. The method of claim 9, further comprising removing the patterned second dielectric layer after the patterning of the first dielectric layer.

13. The method of claim 9, wherein the second electrode is thicker than the first metal layer.

14. The method of claim 9, wherein the first dielectric layer is thicker than the second electrode.

15. The method of claim 14, wherein the first dielectric layer is four times thicker than the second electrode.

16. A method comprising in sequential order of:

forming a stack of magnetic tunneling junction (MTJ) layers on a first electrode disposed on a substrate;

forming a second electrode directly on the stack of MTJ layers;

forming a hybrid hard mask directly on the second electrode, wherein the hybrid hard mask includes:

a first dielectric layer disposed directly on the second electrode;

a first metal layer disposed directly on the first dielectric layer; and a second dielectric layer disposed directly on the first metal layer, the second dielectric layer being thinner than the first dielectric layer;

patterning the second dielectric layer and the first metal layer; patterning the first dielectric layer while using the patterned second dielectric layer and the patterned first metal layer as a first mask, patterning the second electrode while using the patterned first dielectric layer as a second mask, wherein a top surface of the patterned first metal layer is exposed after the patterning the first dielectric layer and prior to the patterning the second electrode; and etching the stack of MTJ layers and the first electrode using the patterned second electrode as a third mask, wherein the etching the stack of MTJ layers occurs such that re-deposition material is formed on the first electrode without being formed on the stack of MTJ layers.

17. The method of claim 16, wherein the second electrode and the first metal layer are formed of the same material.

18. The method of claim 16, wherein the first dielectric layer and the second dielectric layer are formed of different materials.

19. The method of claim 16, wherein the first dielectric layer and the second dielectric layer both include silicon and oxygen.

20. The method of claim 16, wherein a top surface of the first electrode is exposed after the etching of the stack of MTJ layers and the first electrode, the top surface of the first electrode facing away from the substrate.

* * * * *